United States Patent
Yamasaki et al.

(10) Patent No.: US 10,504,740 B2
(45) Date of Patent: Dec. 10, 2019

(54) METHOD OF REMOVING SILICON OXIDE FILM

(71) Applicant: TOKYO ELECTRON LIMITED, Tokyo (JP)

(72) Inventors: Hideaki Yamasaki, Nirasaki (JP); Takamichi Kikuchi, Nirasaki (JP); Seishi Murakami, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/038,863

(22) Filed: Jul. 18, 2018

(65) Prior Publication Data
US 2019/0027371 A1   Jan. 24, 2019

(30) Foreign Application Priority Data

Jul. 24, 2017  (JP) .................................. 2017-142746

(51) Int. Cl.
*H01L 21/311* (2006.01)
*H01L 21/02* (2006.01)
(Continued)

(52) U.S. Cl.
CPC ......... *H01L 21/31111* (2013.01); *H01J 37/00* (2013.01); *H01L 21/02063* (2013.01); *H01L 21/02118* (2013.01); *H01L 21/02205* (2013.01); *H01L 21/02271* (2013.01); *H01L 21/67017* (2013.01); *H01L 21/6719* (2013.01); *H01L 21/67207* (2013.01); *H01L 21/6831* (2013.01); *H01L 21/76802* (2013.01); *H01L 21/67069* (2013.01); *H01L 21/67103* (2013.01); *H01L 21/67167* (2013.01); *H01L 21/6833* (2013.01)

(58) Field of Classification Search
CPC ......... H01L 21/31111; H01L 21/02063; H01L 21/6831; H01L 21/67017; H01L 21/6719; H01L 21/67207; H01L 21/02271; H01L 21/76802; H01L 21/02205; H01L 21/02118; H01L 21/67103; H01L 21/67069; H01L 21/67167; H01L 21/6833; H01J 37/00
See application file for complete search history.

(56) References Cited

U.S. PATENT DOCUMENTS

2017/0076955 A1\*  3/2017  Hudson ............. H01L 21/30655

FOREIGN PATENT DOCUMENTS

WO        2007049510 A1    5/2007

\* cited by examiner

*Primary Examiner* — Nadine G Norton
*Assistant Examiner* — Mahmoud Dahimene
(74) *Attorney, Agent, or Firm* — Nath, Goldberg & Meyer; Jerald L. Meyer

(57) ABSTRACT

Provided is a method of removing a silicon oxide film of a workpiece having an insulating film and the silicon oxide film exposed at a bottom portion of an opening formed in the insulating film, including: forming a protective film containing carbon on a surface of the workpiece, wherein the protective film has a first region extending along a side wall surface of the insulating film that defines the opening and a second region extending on the silicon oxide film: removing the second region of the protective film and the silicon oxide film by sputter etching with ions from plasma of a first inert gas; and removing a residue of the silicon oxide film by chemical etching. The step of forming the protective film includes executing a plurality of cycles.

9 Claims, 9 Drawing Sheets

(51) Int. Cl.
*H01L 21/768* (2006.01)
*H01J 37/00* (2006.01)
*H01L 21/67* (2006.01)
*H01L 21/683* (2006.01)

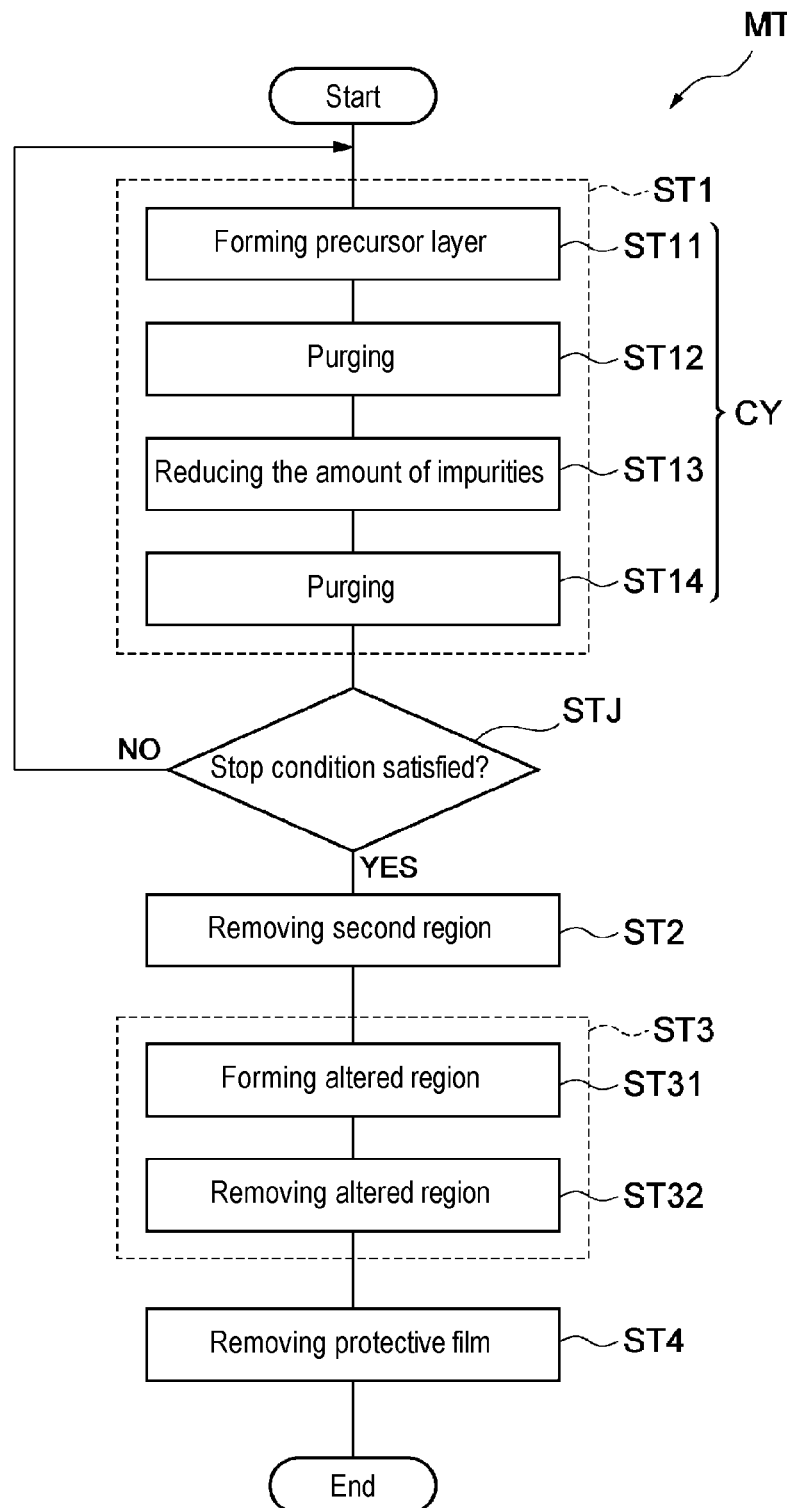

US 10,504,740 B2

METHOD OF REMOVING SILICON OXIDE FILM

CROSS-REFERENCE TO RELATED APPLICATION

This application is based upon and claims the benefit of priority from Japanese Patent Application No. 2017-142746, filed on Jul. 24, 2017, the entire contents of which are incorporated herein by reference.

TECHNICAL FIELD

The present disclosure relates to a method of removing a silicon oxide film.

BACKGROUND

In the manufacture of an electronic device, an opening is formed in an insulating film on a silicon region and a contact connected to the silicon region is formed in the opening. The contact is made of, for example, titanium. Before the contact is formed, a silicon oxide film (natural oxide film) constituting a surface of the silicon region is removed. This silicon oxide film is exposed at a bottom of the opening.

Isotropic etching is generally used to remove the silicon oxide film before the contact is formed. An example of the isotropic etching may include chemical etching in which fluorine and a basic gas in a process gas react with silicon oxide of a silicon oxide film to form an altered region from the silicon oxide film. The altered region formed is removed by heating.

In the isotropic etching as described above, an insulating film is also etched along the lateral direction from a surface defining the opening. When the insulating film is etched, current leakage may occur between contacts of the fabricated electronic device. Therefore, it has been required to etch the silicon oxide film exposed at the bottom of the opening formed in the insulating film while suppressing the insulating film from being etched.

SUMMARY

According to one embodiment of the present disclosure, there is provided a method of removing a silicon oxide film of a workpiece having an insulating film and the silicon oxide film exposed at a bottom portion of an opening formed in the insulating film, including: forming a protective film containing carbon on a surface of the workpiece, wherein the protective film has a first region extending along a side wall surface of the insulating film that defines the opening and a second region extending on the silicon oxide film; removing the second region of the protective film and the silicon oxide film by sputter etching with ions from plasma of a first inert gas; and removing a residue of the silicon oxide film by chemical etching, wherein forming a protective film is executed in a state where the workpiece is disposed in a chamber, and wherein forming a protective film includes: executing a plurality of cycles, each of the cycles including: forming a precursor layer containing carbon on the surface of the workpiece by supplying a carbon-containing gas into the chamber; purging the chamber; reducing the amount of impurities contained in the precursor layer by generating plasma of a second inert gas in the chamber; and purging the chamber.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart showing a method of removing a silicon oxide film according to one embodiment.

DETAILED DESCRIPTION

Figure 2A:
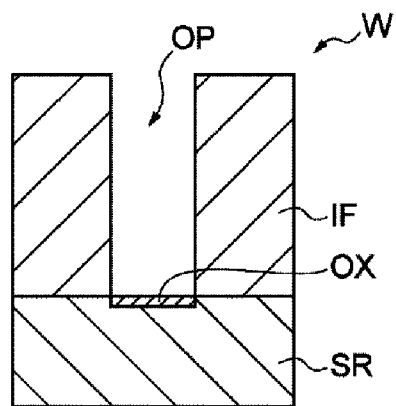
FIG. 2A is a partially enlarged sectional view of an example of a workpiece before application of the method shown in FIG. 1.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Throughout the drawings, the same or equivalent parts or portions are denoted by the same reference numerals.

FIG. 1 is a flowchart showing a method of removing a silicon oxide film according to one embodiment. FIG. 2A is a partially enlarged sectional view of an ample of a workpiece before application of the method shown in FIG. 1. FIGS. 2B, 2C, 2D, 2E and 2F are partially enlarged sectional views of the workpiece during or after execution of the method shown in FIG. 1. Hereinafter, a method MT shown in FIG. 1 will be described by taking a case of applying the method MT to a workpiece W shown in FIG. 2A, as an example. The method MT can be applied to any workpiece having a silicon oxide film and an insulating film and having a structure in which the silicon oxide film is exposed at a bottom portion of an opening formed in the insulating film.

The method MT shown n FIG. 1 includes steps ST1 to ST3. The method MT may further include step ST4. In step ST1 of the method MT, a protective film is formed on a surface of the workpiece. As shown in FIG. 2A, prior to application of the method MT, the workpiece W has a silicon region SR and an insulating film IF. The silicon region SR is made of silicon. The silicon region SR may be, for example, a region that provides the source and drain of a transistor. The insulating film IF is formed on the silicon region SR. The insulating film IF is made of an insulating material such as silicon oxide. An opening OP is formed in the insulating film IF. The opening OP is formed, for example, by transferring a mask pattern onto the insulating film IF by plasma etching. A silicon oxide film OX is exposed at the bottom portion of the opening OP. The silicon oxide film OX is formed, for example, by partial oxidation (for example, natural oxidation) of the silicon region SR.

Step ST1 is executed in a state in which the workpiece W is placed in a chamber. A process module that provides this chamber is a plasma processing apparatus. As shown in FIG. 1, plural cycles CY are executed in step ST1 of the method MT. That is, in step ST1, cycle CY is executed plural times. Each cycle CY includes steps ST11 to ST14.

In step ST11, a carbon-containing precursor layer is formed on a surface of the workpiece W. In order to form the precursor layer, in step ST11, a carbon-containing gas is supplied into the chamber in which the workpiece W is accommodated. The precursor layer is formed when a precursor contained in the carbon-containing gas adheres to the surface of the workpiece W or the protective film already formed.

The carbon-containing gas used in step ST11 may be any gas containing carbon, such as a hydrofluorocarbon gas, a hydrocarbon gas, a fluorocarbon gas or the like. The carbon-containing gas used in step ST11 may be, for example, a $CH_3F$ gas or a $C_3H_6$ gas. In step ST11, together with the carbon-containing gas, a carrier gas may be further supplied into the chamber. The carrier gas is an inert gas, for example, a rare gas. In step ST11, together with the carbon-containing gas, at least one of a chlorine gas ($Cl_2$ gas) and a hydrogen gas ($H_2$ gas) may be further supplied into the chamber.

In the subsequent step ST12, the chamber is purged. In the purging in step ST12, the chamber can be evacuated. In the purging in step ST12, an inert gas may be supplied into the chamber. The inert gas used in step ST12 is, for example, a rare gas. The inert gas used in step ST12 may be the same gas as the carrier gas used in step ST11. In step ST12, an excessive precursor, that is, a precursor excessively adhered to the workpiece W or the already formed protective film is removed.

In the subsequent step ST13, inert gas plasma is generated in the chamber. An inert gas used in step ST13 is, for example, a rare gas. The inert gas used in step ST13 may be the same gas as the carrier gas used in step ST11 or the inert gas used in step ST12. In step ST13, the precursor layer is irradiated with ions and/or radicals from the inert gas plasma. This breaks the bond between carbon and impurities (e.g., hydrogen and/or fluorine) in the precursor layer to remove the impurities separated from the carbon. As a result, the amount of impurities in the precursor layer is reduced.

In the subsequent step ST14, the chamber is purged. In the purging in step ST14, the chamber can be evacuated. In the purging in step ST14, an inert gas may be supplied into the chamber. The inert gas used in step ST14 is, for example, a rare gas. The inert gas used in step ST14 may be the same gas as the carrier gas used in step ST11, the inert gas used in step ST12 or the inert gas used in step ST13. That is, the same inert gas may be continuously supplied into the chamber during the execution of steps ST11 to ST14.

Figure 2B:
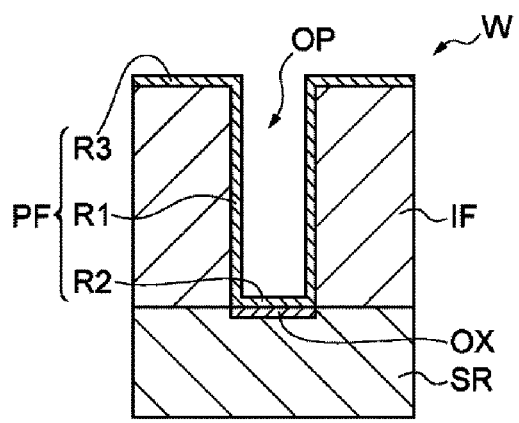
FIGS. 2B, 2C, 2D, 2E and 2F are partially enlarged sectional views of the workpiece during or after execution of the method shown in FIG. 1.

After the execution of step ST14, in step STJ, it is determined whether or not a stop condition is satisfied. The stop condition is determined to be satisfied when the number of times of execution of the cycle CY including steps ST11 to ST14 has reached a predetermined number. When it is determined that the stop condition is not satisfied (NO in step STJ), step ST11 is executed again. In the method MT, plural cycles CY each including steps ST11 to ST14 are executed. When the plural cycles CY are executed, as shown in FIG. 2B, a protective film PF is conformally formed on the surface of the workpiece W, that is, on the surface of the silicon oxide film OX and on the surface of the insulating film IF. The protective film PF includes a first region R1, a second region R2 and a third region R3. The first region R1 extends along a side wall surface of the insulating film IF defining the opening OP. The second region R2 extends on the silicon oxide film OX. The third region R3 extends on an upper surface of the insulating film IF.

Figure 2C:
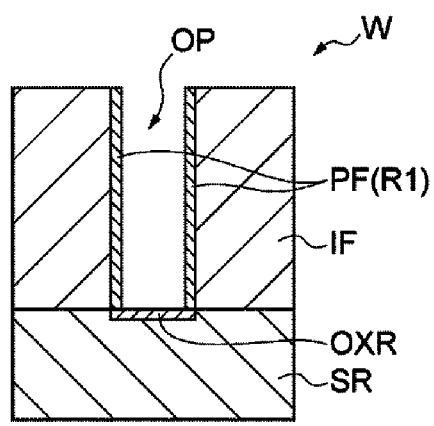

Returning to FIG. 1, when it is determined that the stop condition is satisfied (YES in step STJ), the process proceeds to step ST2. In step ST2, the second region R2 and the silicon oxide film OX are removed by sputter etching with ions from the inert gas plasma. In step ST2, the second region R2 is selectively etched with respect to the first region R1 by sputter etching, that is, anisotropic etching. In step ST2, a plasma processing apparatus is used. The plasma processing apparatus may be the same process module as the process module (that is, the plasma processing apparatus) used to execute step ST1 or a different process module from the process module used to execute step ST1. As shown in FIG. 2C, the third region R3 is also removed together with the second region R2 and the silicon oxide film OX by the sputter etching in the step ST2. In step ST2, the silicon oxide film OX is not completely removed, leaving the residue OXR of the silicon oxide film.

As shown in FIG. 1, in the method MT, step ST3 is subsequently executed. In step ST3, the residue OXR of the silicon oxide film is removed by chemical etching. The etching performed in step ST3 is isotropic etching. For the etching in step ST3, any chemical etching may be used as long as it can remove the residue OXR of the silicon oxide film.

Figure 2D:
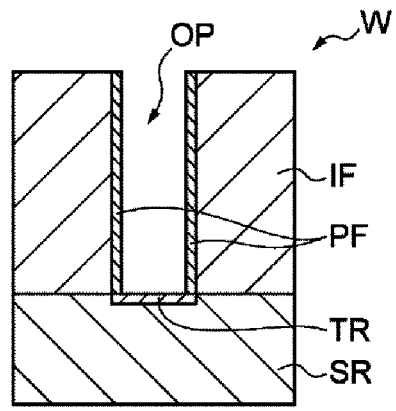

In one embodiment, step ST3 includes steps ST31 and ST32. In step ST31, a process gas is supplied onto the residue OXR of the silicon oxide film. The process gas reacts with the residue OXR of the silicon oxide film such that an altered region TR is formed as shown in FIG. 2D. The altered region TR includes ammonium silicofluoride. Examples of the process gas used to form such an altered region TR may include a HF gas and a $NH_3$ gas.

Figure 2E:
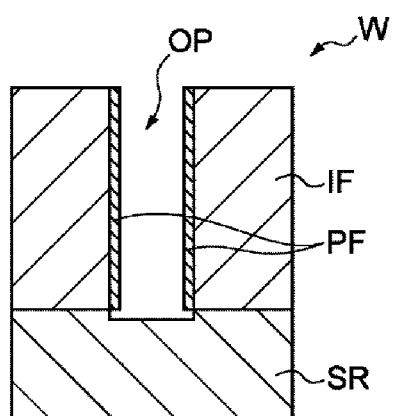

In the subsequent step ST32, the altered region TR is removed as shown in FIG. 2E. Specifically, in step ST32, the workpiece W having the altered region TR is heated to sublimate and exhaust the altered region TR, which results in removal of the residue OXR of the silicon oxide film. In step ST32, a heating step and a purging step may be simultaneously performed. Alternatively, the heating step and the purging step may be non-simultaneously performed (e.g., step ST32A and step ST32B to be described below).

In one embodiment, in step ST3, cycles each including steps ST31 and ST32 can be executed once or more. Step ST31 and step ST32 may be executed using different process modules or may be executed using a single process module. That is, step ST31 and step ST32 may be executed in different chambers or may be executed in a single chamber. In one embodiment, steps ST1 to ST3 may be performed using a single process module. That is, steps ST1 to ST3 may be executed in a state where the workpiece W is placed in a single chamber.

Figure 2F:
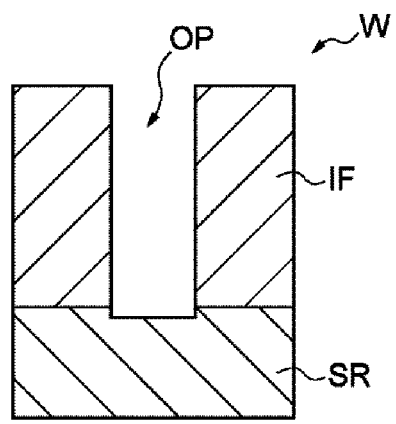

In the subsequent step ST4, the protective film PF is removed as shown in FIG. 2F. The protective film PF is removed by irradiating the protective film PF with active species from plasma of a process gas including a hydrogen gas and a nitrogen gas, for example. Step ST4 may be executed using a process module different from one or more of the process modules used to execute steps ST1 to ST3. When steps ST1 to ST4 are executed using two or more process modules, transfer of the workpiece W between the two or more process modules is performed only through a decompressed environment (for example, a chamber TC of a transfer module TM to be described later). Alternatively, steps ST1 to ST4 may be executed using a single process module. That is, steps ST1 to ST4 may be executed in a state in which the workpiece W is placed in a single chamber.

In the method MT described above, in step ST1, the protective film PF is conformally formed on the surface of the workpiece W. Accordingly, in step ST2, using the sputter etching, it is possible to remove the second region R2 and the silicon oxide film OX while leaving the first region R1 out of the entire region of the protective film PF. Thereafter, in step ST3, the chemical etching is performed to remove the residue OXR of the silicon oxide film. During the execution of the chemical etching in step ST3, the insulating film IF is protected by the first region R1 of the protective film PF left after the execution of step ST2. Accordingly, it is possible to etch the residue OXR of the silicon oxide film while suppressing the insulating film IF from being etched.

In one embodiment, as described above, in step ST11, at least one of the hydrogen gas ($H_2$ gas) and the chlorine gas ($Cl_2$ gas) is further supplied into the chamber together with the carbon-containing gas. According to this embodiment, it is possible to form a more conformal protective film PF by supplying the hydrogen gas ($H_2$ gas). In addition, it is possible to selectively form the protective film by supplying the chlorine gas ($Cl_2$ gas).

Figure 3:
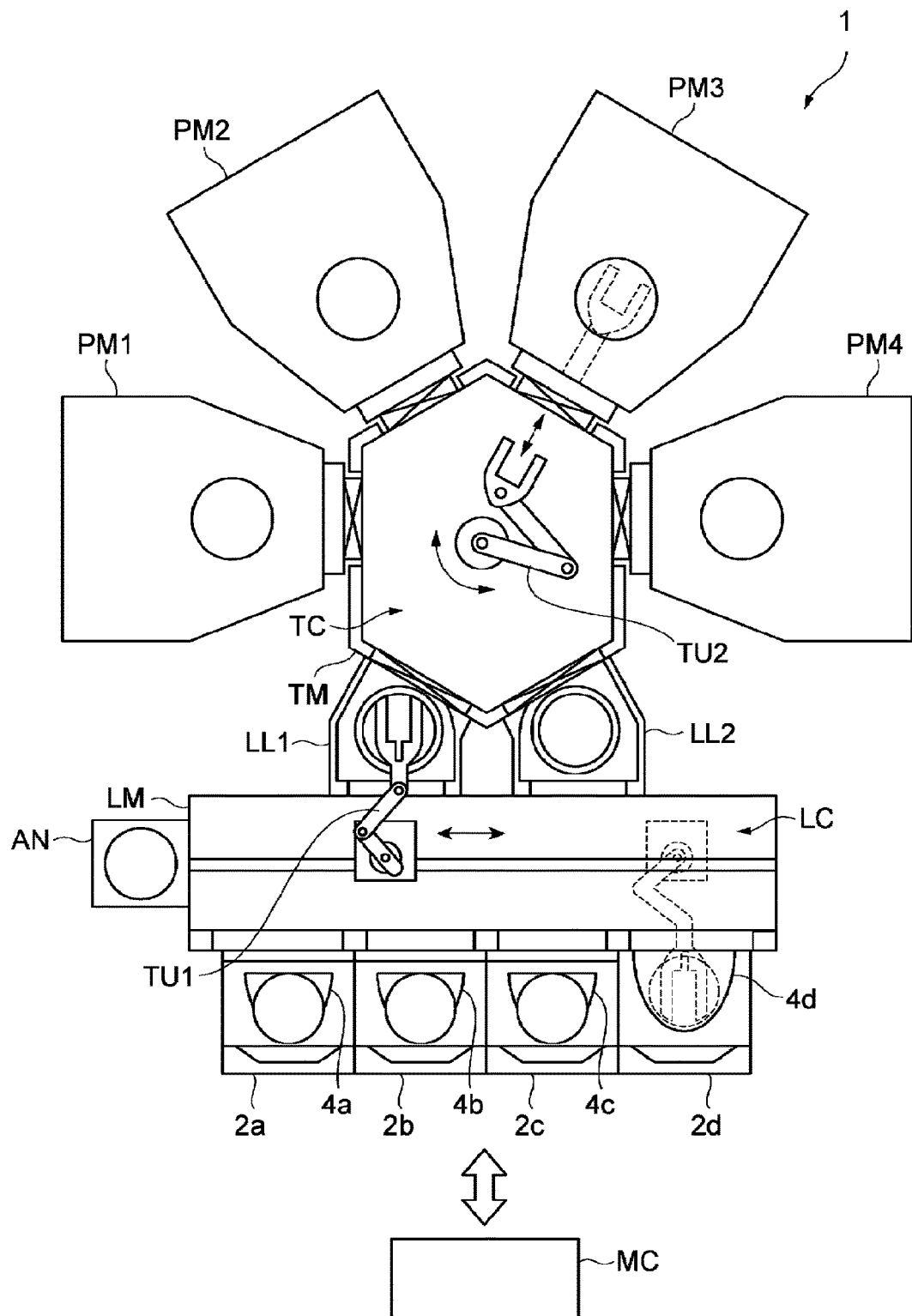
FIG. 3 is a view showing an example of a processing system that can be used to execute the method shown in FIG. 1.

Hereinafter, a processing system that can be used to execute the method MT will be described. FIG. 3 is a view showing an example of a processing system that can be used to execute the method shown in FIG. 1. The processing system 1 shown in FIG. 3 includes tables 2a, 2b, 2c and 2d, containers 4a, 4b, 4c and 4d, a loader module LM, an aligner AN, load lock modules LL1 and LL2, a transfer module TM and process modules PM1, PM2, PM3 and PM4. The number of tables, the number of containers and the number of load lock modules in the processing system 1 may be one or more.

The tables 2a, 2b, 2c and 2d are arranged along one edge of the loader module LM. The containers 4a, 4b, 4c and 4d are disposed on the tables 2a, 2b, 2c and 2d, respectively. The containers 4a, 4b, 4c and 4d are configured to accommodate the workpiece W therein. Each of the containers 4a, 4b, 4c and 4d may be a container called FOUP (Front-Opening Unified Pod).

An internal chamber LC is provided inside the loader module LM. The pressure of the chamber LC is set to the atmospheric pressure. The loader module LM includes a transfer device TU1. The transfer device TU1 is, for example, an articulated robot. The transfer device TU1 is configured to transfer the workpiece W between each of the containers 4a, 4b, 4c and 4d and the aligner AN, between the aligner AN and each of the load lock modules LL1 and LL2 and between each of the containers 4a, 4b, 4c and 4d and each of the load lock modules LL1 and LL2, via the chamber LC. The aligner AN is connected to the loader module LM. The aligner AN calibrates the position of the workpiece W therein.

The load lock modules LL1 and LL2 are interposed between the loader module LM and the transfer module TM. Each of the load lock modules LL1 and LL2 has a preliminary decompression chamber. A gate valve is interposed between the preliminary decompression chamber of each of the load lock modules LL1 and LL2 and the chamber LC.

An internal chamber TC is provided inside the transfer module TM. The chamber TC is configured to be decompressed. A gate valve is interposed between the chamber TC and each of the load lock modules LL1 and LL2. The transfer module TM has a transfer device TU2. The transfer device TU2 is, for example, an articulated robot. The transfer device TU2 is configured to transfer the workpiece W between each of the load lock modules LL1 and LL2 and each of the process modules PM1, PM2, PM3 and PM4 and between any two of the process modules PM1, PM2, PM3 and PM4, via the chamber TC.

Each of the process modules PM1, PM2, PM3 and PM4 is a device that executes dedicated substrate processing. The chambers of the process modules PM1, PM2, PM3 and PM4 are connected to the chamber TC via their respective gate valves. The number of process modules in the processing system 1 may be one or more. In one example, one process module of the processing system 1 is a plasma processing apparatus to be described later, and steps ST1 to ST4 can be executed using the plasma processing apparatus. In another example, steps ST1, ST2, ST31 of ST3, and ST4 are executed using one process module of the processing system 1, which is a plasma processing apparatus to be described later, and step ST32 of ST3 is executed using the one process module or a different process module. In yet another example, ST1, ST2 and ST4 are executed using one process module of the processing system 1, which is a plasma processing apparatus to be described later, and steps ST31 and ST32 of ST3 are executed using a single process module or different process modules. Steps ST1, ST2 and ST4 may be executed using different plasma processing apparatuses, or two of steps ST1, ST2 and ST4 may be executed using the same plasma processing apparatus. One of the process modules PM1, PM2, PM3 and PM4 may be a film forming apparatus for forming a contact in the opening OP after the execution of step ST4.

The processing system 1 may further include a controller MC. The controller MC is configured to control respective parts of the processing system 1 in the execution of the method MT. The controller MC may be a computer including a processor (for example, a CPU), a storage device such as a memory, and an input/output interface for control signals. The storage device stores a control program and recipe data. When the processor operates according to the control program and the recipe data, control signals are sent to the respective parts of the processing system 1. The method MT can be executed through such an operation of the controller MC.

Figure 4:
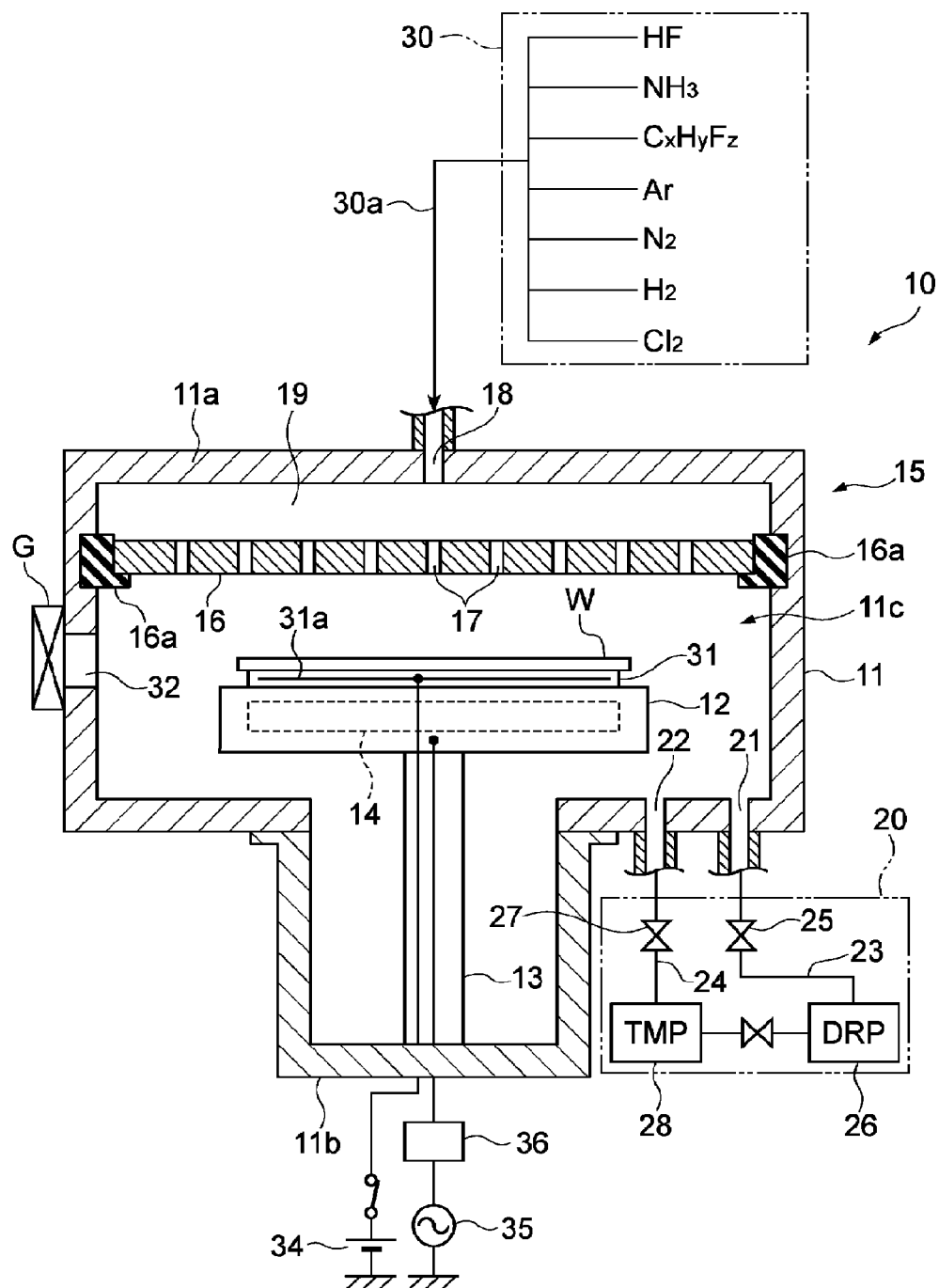
FIG. 4 is a view schematically showing a plasma processing apparatus that can be adopted as a process module of the processing system shown in FIG. 3.

Hereinafter, a plasma processing apparatus that can be adopted as one or more process modules of the processing system 1 will be described. FIG. 4 is a view schematically showing a plasma processing apparatus that can be adopted as a process module of the processing system shown in FIG. 3. A plasma processing apparatus 10 shown in FIG. 4 can be used in at least one of steps ST1 to ST4.

The plasma processing apparatus 10 has substantially a cylindrical chamber main body 11. The chamber main body 11 is made of, for example, aluminum. The chamber main body 11 may be subjected to no surface treatment. An inner wall surface of the chamber main body 11 may be subjected to OGF (Out Gas Free) anodic oxidation treatment. The chamber main body 11 provides its internal space as a chamber 11c. The chamber 11c is a space below a shower plate 16, which will be described later, in the inner space of the chamber main body 11.

The chamber 11c has a susceptor 12 therein. The susceptor 12 is supported by a cylindrical support member 13 installed below the center of the susceptor 12. An opening is formed in the center of a bottom portion of the chamber main body 11. A cylindrical protrusion 11b is connected to the bottom portion of the chamber main body 11 so as to close the opening. The support member 13 is supported at a bottom portion of the protrusion 11b.

An electrostatic chuck 31 is disposed on the susceptor 12. The workpiece W is placed on an upper surface of the electrostatic chuck 31. The plasma processing apparatus 10 includes, for example, three lift pins. The lift pins are a mechanism used to dispose the workpiece W on the electrostatic chuck 31 and to move the workpiece W upward from the electrostatic chuck 31. The lift pins are movable between a position at which their tips project upward from the upper surface of the electrostatic chuck 31 and a position at which their tips retract downward from the upper surface of the electrostatic chuck 31.

The electrostatic chuck 31 has an electrode 31a inside its main body formed of a dielectric material such as aluminum oxide. When a voltage is applied from a DC power supply 34 to the electrode 31a, an electrostatic attractive force is generated between the electrostatic chuck 31 and the workpiece W. Due to the generated electrostatic attractive force, the workpiece W is attracted to the electrostatic chuck 31. As a result, the workpiece W is held by the electrostatic chuck 31.

The susceptor 12 has a body section. The body section of the susceptor 12 is made of, for example, aluminum, and an insulating ring is formed on an outer periphery of the body section. A temperature adjusting mechanism 14 for adjusting a temperature of the workpiece W through an electrostatic chuck 31 is installed inside the susceptor 12. The temperature adjusting mechanism 14 includes a flow path formed inside the susceptor 12. A heat exchange medium whose temperature is controlled is supplied to the flow path. The temperature adjusting mechanism 14 is configured to adjust the temperature of the workpiece W to a temperature suitable for processing, for example, a temperature within a range of 10 degrees C. to 150 degrees C. The temperature adjusting mechanism 14 may include one or more heaters installed inside the susceptor 12. One or more heaters ay be installed inside the electrostatic chuck 31.

A shower head 15 is installed in an upper portion of the chamber main body 11. The shower head 15 includes a shower plate 16. The shower plate 16 is installed below a ceiling wall 11a of the chamber main body 11 and above the electrostatic chuck 31. The shower plate 16 has substantially a disk shape. A plurality of gas discharge holes 17 is formed in the shower plate 16. The shower plate 16 may have, for example, a structure in which a thermal sprayed coating made of yttrium oxide is formed on a surface of a main body made of aluminum. The shower plate 16 and the chamber main body 11 are electrically isolated from each other by a ring-shaped insulating member 16a.

A gas introduction port 18 is formed in the center of the ceiling wall 11a of the chamber main body 11. A gas diffusion space 19 is formed between the ceiling wall 11a and the shower plate 16.

A gas pipe 30a of a gas supply mechanism 30 is connected to the gas introduction port 18. A gas from the gas supply mechanism 30 is introduced into the gas diffusion space 19 from the gas introduction port 18, diffused in the gas diffusion space 19, and then discharged from the gas discharge holes 17 of the shower plate 16 into the chamber 11c.

The gas supply mechanism 30 has a plurality of gas supply sources. The plurality of gas supply sources includes supply sources of a HF gas, a $NH_3$ gas, a $C_xH_yF_z$ gas, an Ar gas, a $N_2$ gas, a $H_2$ gas and a $Cl_2$ gas. The $C_xH_yF_x$ gas is a carbon-containing gas, for example, a $CH_3F$ gas. In addition, the gas supply mechanism 30 has a plurality of gas supply pipes for supplying respective gases from the plurality of gas supply sources. Each of the plurality of gas supply pipes is provided with an opening/closing valve and a flow rate controller (e.g., a mass flow controller). Thus, it is possible to supply or stop a gas from each of the plurality of gas supply sources and to adjust the flow rate of the gas from each of the plurality of gas supply sources. The gases from the plurality of gas supply pipes are supplied to the shower head 15 via the gas pipe 30a.

A high frequency power source 35 is connected to the susceptor 12 via a matching device 36. High frequency power from the high frequency power supply 35 is supplied to the susceptor 12. The susceptor 12 functions as a lower electrode and the shower plate 16 functions as an upper electrode. That is, the susceptor 12 and the shower plate 16 constitute a pair of parallel plate electrodes. When the high frequency power is supplied to the susceptor 12, capacitively-coupled plasma is generated in the chamber 11c. In addition, when the high frequency power is supplied from the high frequency power supply 35 to the susceptor 12, ions in the plasma are drawn into the workpiece W. The frequency of the high frequency power output from the high frequency power supply 35 is set to a frequency within a range of, for example, 0.1 to 500 MHz. In one embodiment, the frequency of the high frequency power output from the high frequency power supply 35 is, for example, 13.56 MHz.

An exhaust mechanism 20 is connected to the bottom portion of the chamber main body 11. The exhaust mechanism 20 includes a first exhaust pipe 23, a second exhaust pipe 24, a first pressure control valve 25, a dry pump 26, a second pressure control valve 27 and a turbo molecular pump 28. The first exhaust pipe 23 is connected to an exhaust port 21 formed at the bottom portion of the chamber main body 11. The first pressure control valve 25 and the dry pump 26 are disposed on the first exhaust pipe 23. The second exhaust pipe 24 is connected to an exhaust port 22 formed at the bottom portion of the chamber main body 11. The second pressure control valve 27 and the turbo molecular pump 28 are disposed on the second exhaust pipe 24. In a film forming process in which the pressure of the chamber 11c is set to a high pressure, the chamber 11c is evacuated with only the dry pump 26. Both the dry pump 26 and the turbo molecular pump 28 are used for plasma treatment in which the pressure of the chamber 11c is set to a low pressure. The pressure of the chamber 11c is adjusted by controlling the opening degree of each of the first pressure control valve 25 and the second pressure control valve 27 based on a detected value of a pressure sensor that measures the pressure of the chamber 11c.

An opening 32 is formed in a side wall of the chamber main body 11. The workpiece W passes through the opening 32 when it is loaded into the chamber 11c and unloaded from the chamber 11c. In the plasma processing apparatus 10, a gate valve G for opening/closing the opening 32 is installed along the side wall of the chamber main body 11. The transfer of the workpiece W is performed by the transfer device TU2 described above.

When the plasma processing apparatus 10 is used to execute step ST1, a precursor gas is supplied into the chamber 11c in step ST11, an inert gas is supplied into the chamber 11c in step ST12, inert gas plasma is generated in the chamber 11c in step ST13, and an inert gas is supplied into the chamber 11c in step ST14. During the execution of steps ST11 to ST14, the chamber 11c is decompressed by the exhaust mechanism 20.

When the plasma processing apparatus 10 is used to execute step ST2, inert gas plasma is generated in the chamber 11c. During the execution of step ST2, the chamber 11c is decompressed by the exhaust mechanism 20. Ions from the plasma are drawn into the workpiece W by self-bias potential or bias power from the high frequency power source 35, thereby sputter etching in step ST2 is performed.

When the plasma processing apparatus 10 is used to execute step ST3, the above-described process gas is supplied into the chamber 11c in step ST31 and the workpiece W is heated by one or more heaters of the susceptor 12 in step ST32. During the execution of step ST3, the chamber 11c is decompressed by the exhaust mechanism 20.

When the plasma processing apparatus 10 is used to execute step ST4, plasma of a process gas containing a hydrogen gas and a nitrogen gas is generated in the chamber 11c. During the execution of step ST4, the chamber 11c is decompressed by the exhaust mechanism 20.

Figure 5:
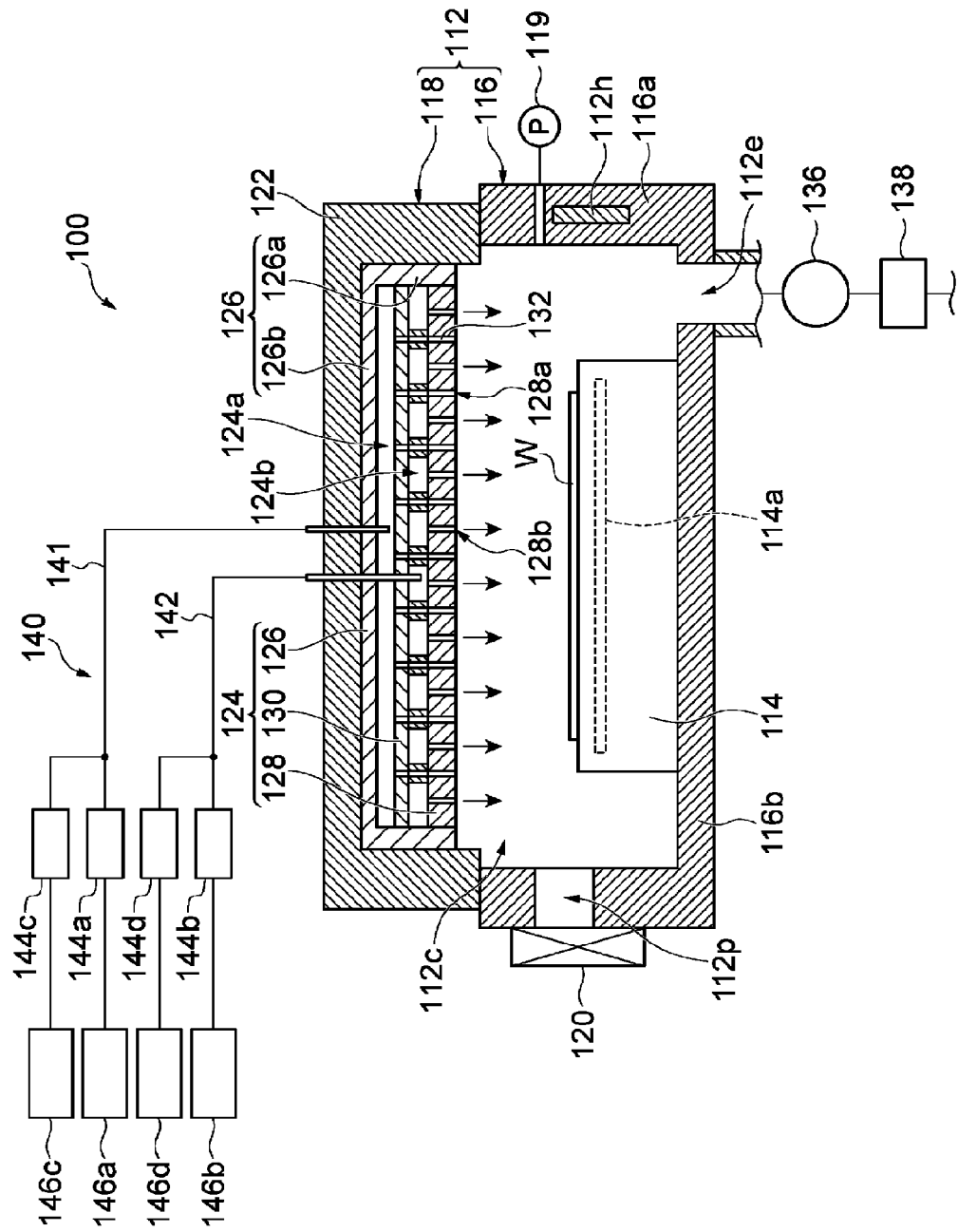
FIG. 5 is a view showing an example of a processing apparatus that can be adopted as the process module of the processing system shown in FIG. 3

Hereinafter, a processing apparatus that can be used to execute step ST31 will be described. FIG. 5 is a view showing an example of a processing apparatus that can be adopted as a process module of the processing system shown in FIG. 3. The processing apparatus 100 shown in FIG. 5 is a processing apparatus that can be adopted as one process module of the processing system 1, and can be used to execute step ST31.

The processing apparatus 100 has a chamber main body 112. The chamber main body 112 provides its internal space as a chamber 112c. A stage 114 is installed inside the chamber 112c. A workpiece W is substantially horizontally placed on the stage 114. The stage 114 is configured to support the workpiece W placed thereon. The stage 114 is substantially circular when viewed from top. The stage 114 is fixed to a bottom portion of the chamber main body 112. The stage 114 has a temperature adjusting mechanism 114a. In one example, the temperature adjusting mechanism 114a includes a flow path formed inside the stage 114. A heat exchange medium feeder (not shown) is installed outside the chamber main body 112. A heat exchange medium (for example, a refrigerant) is supplied from the feeder to the flow path inside the stage 114. The heat exchange medium supplied to the flow path inside the stage 114 is returned to the feeder. That is, the heat exchange medium is circulated between the feeder and the flow path inside the stage 114. When the heat exchange medium is supplied to the flow path inside the stage 114, the temperature of the stage 114 is adjusted.

The processing apparatus 100 further includes a pressure sensor 119. The pressure sensor 119 is, for example, a capacitance manometer. The pressure sensor 119 is configured to measure a pressure of the chamber 112c.

In one example, the chamber main body 112 includes a first member 116 and a second member 118. The first member 116 extends a side portion and a lower portion of the chamber 112c. The first member 116 includes a side wall portion 116a and a bottom portion 116b. The side wall portion 116a has substantially a cylindrical shape. The bottom portion 116b is continuous to a lower end of the side wall portion 116a. A passage 112p is formed in the side wall portion 116a. The workpiece W passes through the passage 112p when the workpiece W is loaded into the chamber 112c from the outside of the chamber main body 112 and when the workpiece W is unloaded from the chamber 112c to the outside of the chamber main body 112. A gate valve 120 is installed along the side wall portion 116a to open/close the passage 112p. When the gate valve 120 opens the passage 112p, the chamber 112c and the chamber TC of the transfer module TM communicate with each other. On the other hand, when the gate valve 120 closes the passage 112p, the chamber 112c is isolated from the chamber TC of the transfer module TM.

The first member 116 has an opening formed at its upper end. The second member 118 is installed on the first member 116 so as to close the opening at the upper end of the first member 116. A heater 112h is installed in a wall portion of the chamber main body 112. The heater 112h is, for example, a resistive heater. The heater 112h heats the chamber main body 112.

The second member includes a lid portion 122 and a shower head 124. The lid portion 122 constitutes an outer portion of the second member 118. The shower head 124 is installed inside the lid portion 122. The shower head 124 is installed above the stage 114. The shower head 124 includes a main body 126 and a shower plate 128. The main body 126 includes a side wall 126a and an upper wall 126b. The side wall 126a has substantially a cylindrical shape and the upper wall 126b is continuous with an upper end of the side wall 126a, thereby closing the upper end of the side wall 126a.

The shower plate 128 is installed on a lower end side of the main body 126 and an inner side of the main body 126. A plate 130 is installed in parallel to the shower plate 128 between the upper wall 126b of the main body 126 and the shower plate 128. A space between the main body 126 and the shower plate 128 includes a first space 124a and a second space 124b. The first space 124a is a space between the upper wall 126b of the main body 126 and the plate 130. The second space 124b is a space between the plate 130 and the shower plate 128.

The processing apparatus 100 further includes a gas supply part 140. A first gas supply pipe 141 of the gas supply part 140 is connected to the first space 124a of the shower head 124. A plurality of gas passages 132 is connected to the first space 124a. The plurality of gas passages 132 extends from the plate 130 to the shower plate 128. The plurality of gas passages 132 is respectively connected to a plurality of first gas discharge holes 128a formed in the shower plate 128. A gas supplied from the first gas supply pipe 141 to the first space 124a is discharged into the chamber 112c via the plurality of gas passages 132 and the plurality of first gas discharge holes 128a.

A second gas supply pipe 142 of the gas supply part 140 is connected to the second space 124b of the shower head 124. A plurality of second gas discharge holes 128b formed in the shower plate 128 is connected to the second space 124b. A gas supplied from the second gas supply pipe 142 to the second space 124b is discharged into the chamber 112c via the plurality of second gas discharge holes 128b.

The gas supply pail 140 includes a plurality of flow rate controllers 144a to 144d in addition to the first gas supply pipe 141 and the second gas supply pipe 142. Each of the plurality of flow rate controllers 144a to 144d is a mass flow controller or a pressure-controlled flow rate controller. Each of the flow rate controllers 144a to 144d adjusts the flow rate of a gas supplied to the input of the flow rate controller and outputs the gas whose flow rate has been adjusted from the output of the flow rate controller.

The input of the flow rate controller 144a is connected to a gas source 146a. The gas source 146a is a source of hydrogen fluoride (HF) gas. The output of the flow rate controller 144a is connected to the first gas supply pipe 141. The input of the flow rate controller 144b is connected to a gas source 146b. The gas source 146b is a source of ammonia (NH₃) gas. The output of the flow rate controller 144b is connected to the second gas supply pipe 142. The input of the flow rate controller 144c is connected to a gas source 146c. The output of the flow rate controller 144c is connected to the first gas supply pipe 141. The input of the flow rate controller 144d is connected to a gas source 146d. The output of the flow rate controller 144d is connected to the second gas supply pipe 142. Each of the gas source 146c and the gas source 146d is a source of inert gas. For example, the gas source 146c is a source of rare gas such as an Ar gas and the gas source 146d is a source of nitrogen ($N_2$) gas.

The processing apparatus 100 further includes a valve 136 and an exhaust device 138. An exhaust port 112e is installed at the bottom portion of the chamber main body 112. The exhaust port 112e communicates to the chamber 112c. The exhaust device 138 is connected to the exhaust port 112e via the valve 136. The valve 136 is, for example, an automatic pressure control valve. The exhaust device 138 includes a vacuum pump such as a dry pump or a turbo molecular pump.

When a process gas containing a HF gas and an $NH_3$ gas is supplied into the chamber 112c in a state where the workpiece W is accommodated in the chamber 112c, the process gas reacts with the residue OXR of the silicon oxide film to form an altered region TR from the residue OXR of the silicon oxide film.

Figure 6:
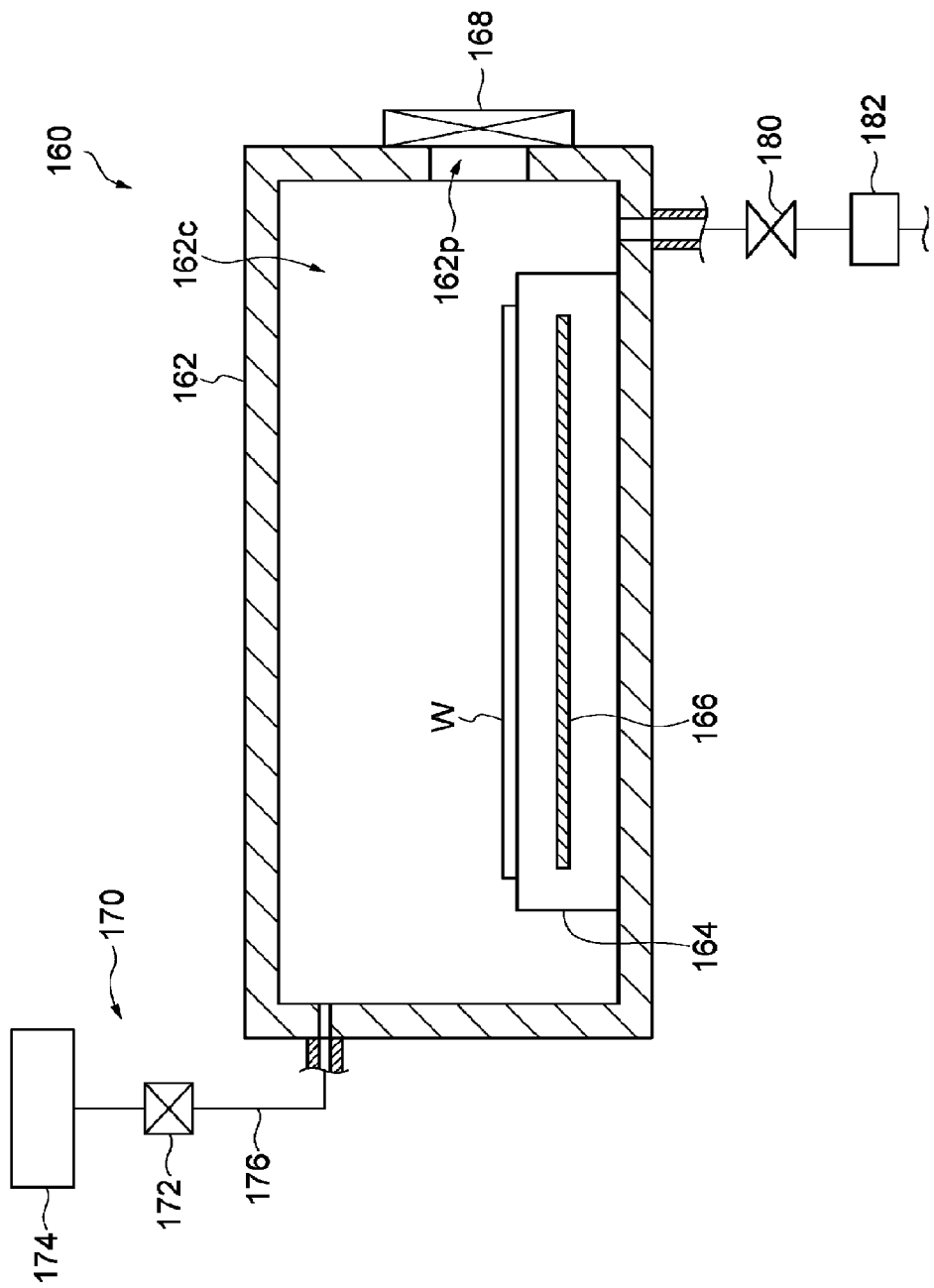
FIG. 6 is a view showing an example of a processing apparatus that can be adopted as the process module of the processing system show in FIG. 3

Hereinafter, a processing apparatus that can be used to execute step ST32 will be described. FIG. 6 is a view showing an example of a processing apparatus that can be adopted as a process module of the processing system shown in FIG. 3. A processing apparatus 160 shown in FIG. 6 is a processing apparatus that can be adopted as one process module of the processing system 1, and can be used to execute step ST32.

The processing apparatus 160 includes a chamber main body 162. The chamber main body 162 provides its internal space as a chamber 162c. A stage 164 is installed inside the chamber 162c. The stage 164 is configured to support a workpiece W placed thereon. A heater 166 is installed inside the stage 164. The heater 166 is, for example, a resistive heater.

A passage 162p is formed in a side wall of the chamber main body 162. The workpiece W passes through the passage 162p when the workpiece W is loaded into the chamber 162c from the outside of the chamber main body 162 and the workpiece W is unloaded from the chamber 162c to the outside of the chamber main body 162. A gate valve 168 is installed along the side wall of the chamber main body 162p, to open and close the passage 162p. When the gate valve 168 opens the passage 162p, the chamber 162c and the chamber TC of the transfer module TM communicate with each other. On the other hand, when the gate valve 168 closes the passage 162p, the chamber 162c is isolated from the chamber TC of the transfer module TM.

The processing apparatus 160 further includes a gas supply part 170. The gas supply part 170 includes a flow rate controller 172. The flow rate controller 172 is a mass flow controller or a pressure-controlled flow rate controller. The flow rate controller 172 adjusts the flow rate of a gas supplied to the input of the flow rate controller 172 and outputs the gas whose flow rate has been adjusted from the output of flow rate controller 172. A gas source 174 is connected to the input of the flow rate controller 172. The gas source 174 is a source of inert gas, for example a source of nitrogen ($N_2$) gas. The output of the flow rate controller 172 is connected to the chamber 162c via a pipe 176. The processing apparatus 160 further includes an opening/closing valve 180 and an exhaust device 182. The exhaust device 182 includes a vacuum pump such as a dry pump or a turbo molecular pump, and is connected to the chamber 162c via the opening/closing valve 180.

The workpiece W having the altered region TR described above is transferred from the chamber 112c into the chamber 162c via the chamber TC. The workpiece W is placed on the stage 164 in the chamber 162c. Then, the stage 164 is heated by the heater 166 and the workpiece W is accordingly heated. When the workpiece W is heated, ammonium silicofluoride of the altered region TR is sublimated and exhausted. Thus, the residue OXR of the silicon oxide film is etched.

While various embodiments have been described above, various modifications can be made without being limited to the above-described embodiments. For example, the plasma processing apparatus used in the method MT may be any type of plasma processing apparatus, such as an inductively-coupled plasma processing apparatus or a plasma processing apparatus using a surface wave such as a microwave to generate plasma.

Hereinafter, evaluation experiments conducted for evaluating the method MT will be described.

(First Evaluation Experiment)

Figure 7:
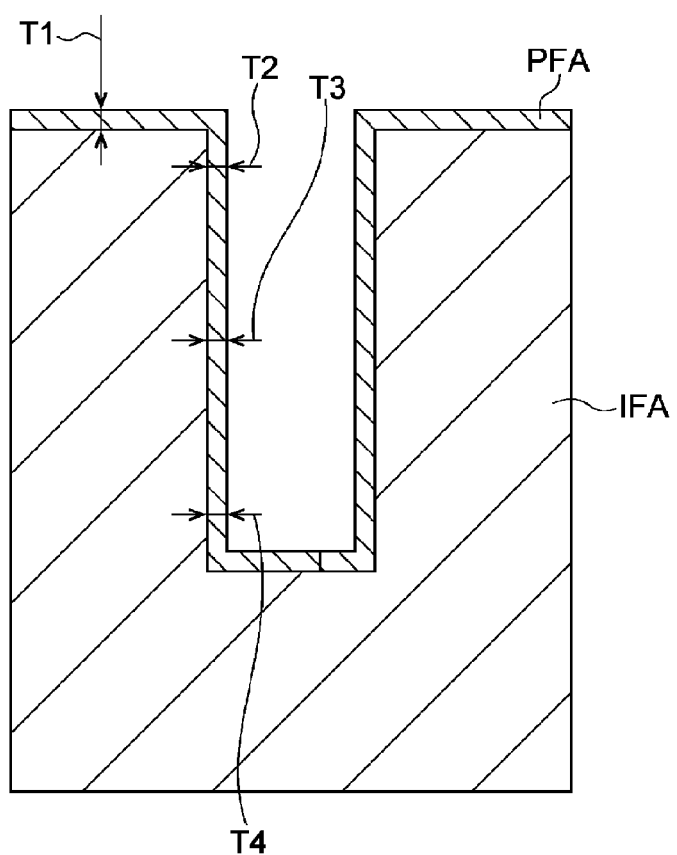
FIG. 7 is a view showing dimensions measured in a first evaluation experiment.

In a first evaluation experiment, the plasma processing apparatus 10 was used to execute step ST1 to form a protective film PFA on a sample. As shown in FIG. 7, the sample has an insulating film IFA made of silicon oxide and an opening is formed in the insulating film IFA. A width of the opening is 8 nm and a depth of the opening is 150 nm. The conditions of step ST1 in the first evaluation experiment are as follows.

<Conditions of Step ST1 in First Evaluation Experiment>
Number of Times of Execution of Cycle CY: 50
Step ST11:
 Flow rate of $CH_3F$ gas: 40 sccm
 Flow rate of Ar gas: 300 sccm
 Temperature of electrostatic chuck 31: 60 degrees C.
 Pressure of chamber: 80 mTorr (10.67 Pa)
 Processing time: 5 seconds
Step ST12:
 Flow rate of Ar gas: 300 sccm
 Temperature of electrostatic chuck 31: 60 degrees C.
 Pressure of chamber: 80 mTorr (10.67 Pa)
 Processing time: 2 seconds
Step ST13:
 Flow rate of Ar gas: 300 sccm
 Temperature of electrostatic chuck 31: 60 degrees C.
 Pressure of chamber: 80 mTorr (10.67 Pa)
 High frequency of high frequency power supply 61: 40 MHz, 150 W
 Processing time: 5 seconds
Step ST14:
 Flow rate of Ar gas: 300 sccm
 Temperature of electrostatic chuck 31: 60 degrees C.
 Pressure of chamber: 80 mTorr (10.67 Pa)
 Processing time: 2 seconds In the first evaluation experiment, the film thicknesses T1 to T4 (see FIG. 7) at four points of the formed protective film PFA were measured. The results of measurement showed that the film thicknesses T1, T2, T3 and T4 were 3.0 nm, 3.1 nm, 3.1 nm and 2.5 nm, respectively. It was confirmed from this that it is possible to conformally form a carbon-containing protective film when step ST1 is executed.

(Second Evaluation Experiment)

Figure 8A:
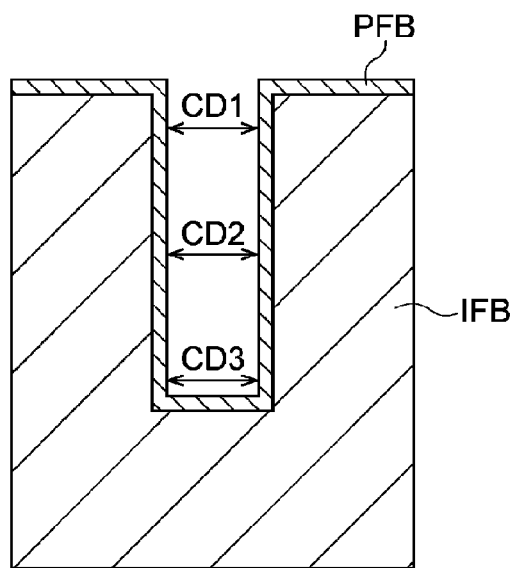
FIG. 8A is a view showing dimensions measured in a second evaluation experiment.

In a second evaluation experiment, step ST1 and step ST3 were executed in order on a sample. As shown in FIG. 8A, the sample has an insulating film IFB made of silicon oxide and an opening is formed in the insulating film IFB. A width of the opening is 9.4 nm and a depth of the opening is 192 nm. The plasma processing apparatus 10 was used in step ST1, the processing apparatus 100 was used in step ST31, and the processing apparatus 160 was used in step ST32. The conditions in the second evaluation experiment are as follows.

<Conditions of Step ST1 in Second Evaluation Experiment>

Number of Times of Execution of Cycle CY: 10
Step ST11:
  Flow rate of $C_3H_6$ gas: 40 sccm
  Flow rate of Ar gas: 300 sccm
  Temperature of electrostatic chuck 31: 60 degrees C.
  Pressure of chamber: 80 mTorr (10.67 Pa)
  Processing time: 5 seconds
Step ST12:
  Flow rate of Ar gas: 300 sccm
  Temperature of electrostatic chuck 31: 60 degrees C.
  Pressure of chamber: 80 mTorr (10.67 Pa)
  Processing time: 2 seconds
Step ST13:
  Flow rate of Ar gas: 300 sccm
  Temperature of electrostatic chuck 31: 60 degrees C.
  Pressure of chamber: 80 mTorr (10.67 Pa)
  High frequency of high frequency power supply 61: 40 MHz, 150 W
  Processing time: 5 seconds
Step ST14:
  Flow rate of Ar gas: 300 sccm
  Temperature of electrostatic chuck 31: 60 degrees C.
  Pressure of chamber: 80 mTorr (10.67 Pa)
  Processing time: 2 seconds <Conditions of Step ST3 in Second Evaluation Experiment>

Number of Times of Execution of Cycle Including Step ST31 and Step ST32: 3
Conditions of Step ST31 in Each Cycle
  Flow rate of HF gas: 150 sccm
  Flow rate of $NH_3$ gas: 90 sccm
  Flow rate of Ar gas: 225 sccm
  Flow rate of $N_2$ gas: 225 sccm
  Pressure of chamber: 450 mTorr (60 Pa)
  Temperature of stage 164: 85 degrees C.
  Processing time: 6 seconds
Conditions of Step ST32 in Each Cycle
Step ST32A: Heating Step
  Flow rate of $N_2$ gas: 225 sccm
  Temperature of stage 164: 85 degrees C.
  Processing time: 5 seconds
Step ST32B: Purging Step
  Chamber: Vacuum
  Gas flow: None
  Processing time: 30 seconds For comparison, a comparative experiment was conducted. In the comparative experiment, the same sample as that used for the second evaluation experiment was used. In the comparative experiment, step ST3 was executed on the sample without executing step ST1. The conditions of step ST3 in the comparative experiment was the same as those of step ST3 in the second evaluation experiment.

Figure 8B:
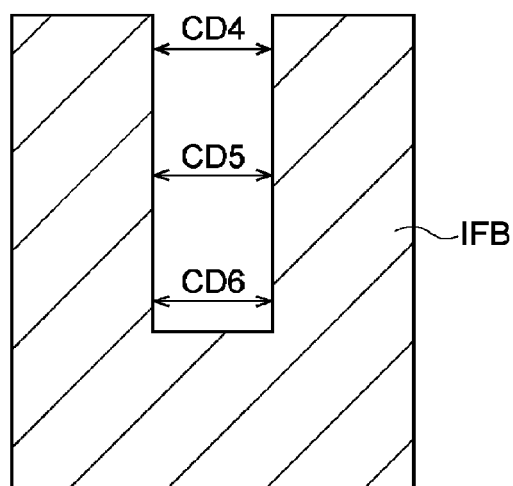
FIG. 8B is a view showing dimensions measured in a comparative experiment.

In the second evaluation experiment, the amounts of change in opening widths CD1, CD2 and CD3 (see FIG. 8A) before and after the execution of step ST1 and step ST3 were obtained. In addition, in the comparative experiment, the amounts of change in opening widths CD4, CD5 and CD6 (see FIG. 8B) before and after the execution of step ST3 were obtained. The results showed that the amount of change in CD1, the amount of change in CD2 and the amount of change in CD3 were 1 nm, 0.2 nm and 1.3 nm, respectively. On the other hand, the amount of change in CD4, the amount of change in CD5 and the amount of change in CD6 were 21.9 nm, 22.8 nm and 18.6 nm, respectively. From this, it was confirmed that the insulating film IFB is etched in the lateral direction with respect to the opening when step ST3 is executed without forming a protective film, whereas the insulating film IFB is protected against the etching of step ST3 when the protective film PFB is formed on the insulating film IFB.

According to the present disclosure in some embodiments, it is possible to etch a silicon oxide film exposed at a bottom portion of an opening formed in an insulating film while suppressing the insulating film from being etched.

According to the present disclosure in some embodiments, a protective film is formed by repeating formation of a precursor layer, removal of an excessive precursor by purging, and reduction of the amount of impurities in the precursor layer. Thus, a conformal protective film is formed on a surface of the silicon oxide film and on a surface of the insulating film. Then, sputter etching is performed to selectively remove the silicon oxide film and a second region of the protective film extending on the surface of the silicon oxide film with respect to a first region of the protective film extending along a side wall surface of the insulating film. Thereafter, isotropic chemical etching is performed on the residue of the silicon oxide film. During the execution of the chemical etching, the insulating film is protected by the protective film. Thus, it is possible to etch the silicon oxide film while suppressing the insulating film from being etched.

In addition, according to the present disclosure in some embodiments, it is possible to form a more conformal protective film PF by supplying a hydrogen gas. Further, it is possible to selectively form a protective film by supplying a chlorine gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of removing a silicon oxide film of a workpiece having an insulating film and the silicon oxide film exposed at a bottom portion of an opening formed in the insulating film, comprising:

forming a protective film containing carbon on a surface of the workpiece, wherein the protective film has a first region extending along a side wall surface of the insulating film that defines the opening and a second region extending on the silicon oxide film;

removing the second region of the protective film and the silicon oxide film by sputter etching with ions from plasma of a first inert gas; and removing a residue of the silicon oxide film by chemical etching, wherein forming a protective film is executed in a state where the workpiece is disposed in a chamber, and
wherein forming a protective film includes:
    executing a plurality of cycles, each of the cycles including:
        forming a precursor layer containing carbon on the surface of the workpiece by supplying a carbon-containing gas into the chamber;
        purging the chamber;
        reducing the amount of impurities contained in the precursor layer by generating plasma of a second inert gas in the chamber; and
        purging the chamber.

2. The method of claim 1, wherein the carbon-containing gas is a hydrofluorocarbon gas.

3. The method of claim 2, wherein the carbon-containing gas is a $CH_3F$ gas.

4. The method of claim 1, wherein the carbon-containing gas is a hydrocarbon gas.

5. The method of claim 1, wherein forming a precursor layer includes further supplying at least one of a chlorine gas and a hydrogen gas into the chamber.

6. The method of claim 1, wherein the second inert gas used in reducing the amount of impurities is a rare gas.

7. The method of claim 1, wherein the first inert gas used in removing the second region of the protective film and the silicon oxide film is a rare gas.

8. The method of claim 1, wherein removing a residue of the silicon oxide film includes:
    forming an altered region from the residue of the silicon oxide film by supplying a process gas to the residue of the silicon oxide film, wherein the altered region contains ammonium silicofluoride; and
    removing the altered region by heating the workpiece having the altered region.

9. The method of claim 8, wherein the process gas contains a HF gas and a $NH_3$ gas.

* * * * *